United States Patent
Abou Ghaida et al.

(10) Patent No.: US 8,516,403 B2
(45) Date of Patent: Aug. 20, 2013

(54) MULTIPLE PATTERNING LAYOUT DECOMPOSITION FOR EASE OF CONFLICT REMOVAL

(75) Inventors: Rani S. Abou Ghaida, Mount Kisco, NY (US); Kanak B. Agarwal, Austin, TX (US); Lars W. Liebmann, Poughquag, NY (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/223,844

(22) Filed: Sep. 1, 2011

(65) Prior Publication Data

US 2013/0061183 A1 Mar. 7, 2013

(51) Int. Cl.
*G06F 17/50* (2006.01)
(52) U.S. Cl.
USPC .............................. 716/52; 716/55
(58) Field of Classification Search
USPC ....................................... 716/52, 55
See application file for complete search history.

(56) References Cited

U.S. PATENT DOCUMENTS

| | | | |
|---|---|---|---|
| 2008/0189672 A1* | 8/2008 | Shin et al. | 716/19 |
| 2008/0244503 A1* | 10/2008 | Graur et al. | 716/19 |
| 2008/0244504 A1 | 10/2008 | Drapeau et al. | |
| 2009/0125866 A1* | 5/2009 | Wang et al. | 716/19 |
| 2011/0003254 A1 | 1/2011 | Chang et al. | |
| 2011/0014786 A1 | 1/2011 | Sezginer et al. | |

OTHER PUBLICATIONS

Chiou, Tsann-Bim et al., "Development of Layout Split Algorithms and Printability Evaluation for Double Patterning Technology", Proceedings of SPIE—The International Society for Optical Engineering, vol. 6924, 2008, 10 pages.

Gupta, Mohit et al., "Timing Yield-Aware Color Reassignment and Detailed Placement Perturbation for Bimodal CD Distribution in Double Patterning Lithography", IEEE Transaction on Computer-Aided Design of Integrated Circuits and Systems, vol. 1242.29, No. 8, Aug. 2010, pp. 1229-1242.

* cited by examiner

*Primary Examiner* — Thuan Do
*Assistant Examiner* — Mohammed Alam
(74) *Attorney, Agent, or Firm* — Stephen R. Tkacs; Stephen J. Walder, Jr.; Eustus O. Nelson

(57) ABSTRACT

A mechanism is provided for multiple patterning lithography with conflict removal aware coloring. The mechanism makes multiple patterning coloring aware of the conflict removal overhead. The coloring solution explicitly considers ease of conflict removal as one of the coloring objectives. The mechanism pre-computes how much shapes can move in each direction. The mechanism generates a conflict graph where nodes represent shapes in the layout and edges represent conflicts between shapes. The mechanism assigns weights to edges based on available spatial slack between conflicting features. The mechanism then uses the weights to guide multiple patterning coloring. The mechanism prioritizes conflicting features with higher weights to be assigned different colors.

20 Claims, 9 Drawing Sheets

MULTIPLE PATTERNING LAYOUT DECOMPOSITION FOR EASE OF CONFLICT REMOVAL

The present application relates generally to an improved data processing apparatus and method and more specifically to mechanisms for multiple patterning layout decomposition for ease of conflict removal.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

Multiple patterning is a class of technologies developed for photolithography to enhance feature density. The simplest case of multiple patterning is double patterning, where a conventional lithography process is enhanced to produce double the expected number of features. Double exposure is a sequence of two separate exposures of the same photoresist layer using two different photomasks. This technique is commonly used for patterns in the same layer which have incompatible densities or pitches. In one important case, the two exposures may each consist of lines which are oriented in one or the other of two usually perpendicular directions. This allows the decomposition of two-dimensional patterns into two one-dimensional patterns which are easier to print.

Double pattern lithography (DPL) is an effective technique to improve resolution. DPL theoretically doubles resolution through pitch splitting such that effective pitch of the layout for each patterning step is halved. DPL, involves two separate exposure and etch/freeze steps (litho-etch-litho-etch or litho-freeze-litho-etch), DPL is expected to be needed for 20 nm technology and is one of the best candidate solutions for scaling to 14 nm technology and beyond.

For one-dimensional patterns at minimum pitch, layout decomposition for double patterning is trivial. Decomposition is very complex for more complicated two-dimensional patterns. DPL layout decomposition solutions typically cast layout decomposition as a graph coloring problem where two features less than a certain minimum spacing must be assigned different colors. DPL decomposition is very challenging to implement at the full-chip level, particularly when stitch insertion is considered. A stitch insertion in a polygon during decomposition indicates that one part of the polygon will be printed in the first patterning step while the remaining part of the polygon will be printed using second patterning, with the two parts joining together at the stitch location. Stitches can help in removing some decomposition conflicts but they can potentially break a polygon into multiple pieces. Conflicts that cannot be removed with stitch insertion require layout modification (sometimes major), which can be very challenging and costly (increase layout area). As a result, considering all candidate stitch insertion locations during layout decomposition is crucial to take full advantage of stitching capability.

SUMMARY

In one illustrative embodiment, a method, in a data processing system, is provided for multiple patterning lithography with conflict removal aware coloring. The method comprises receiving a design layout for performing a multiple patterning photolithographic process to form an integrated circuit design. The method further comprises generating a conflict graph representing conflicts between shapes and assigning weights to conflicts in the conflict graph representing ease of conflict removal to form a weighted conflict graph. The method further comprises performing coloring of the design layout based on the weighted conflict graph to form a colored design layout and performing the multiple patterning photolithographic process using the colored design layout.

In one other illustrative embodiment, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism for multiple patterning lithography with conflict removal aware coloring. The mechanism of the illustrative embodiments makes multiple patterning coloring aware of the conflict removal overhead. The coloring solution explicitly considers ease of conflict removal as one of the coloring objectives. The mechanism pre-computes how much shapes can move in each direction. The mechanism generates a conflict graph where nodes represent shapes in the layout and edges represent conflicts between shapes. The mechanism assigns weights to edges based on available spatial slack between conflicting features. The mechanism then uses the weights to guide multiple patterning coloring. The mechanism prioritizes conflicting features with higher weights to be assigned different colors.

Figure 1:
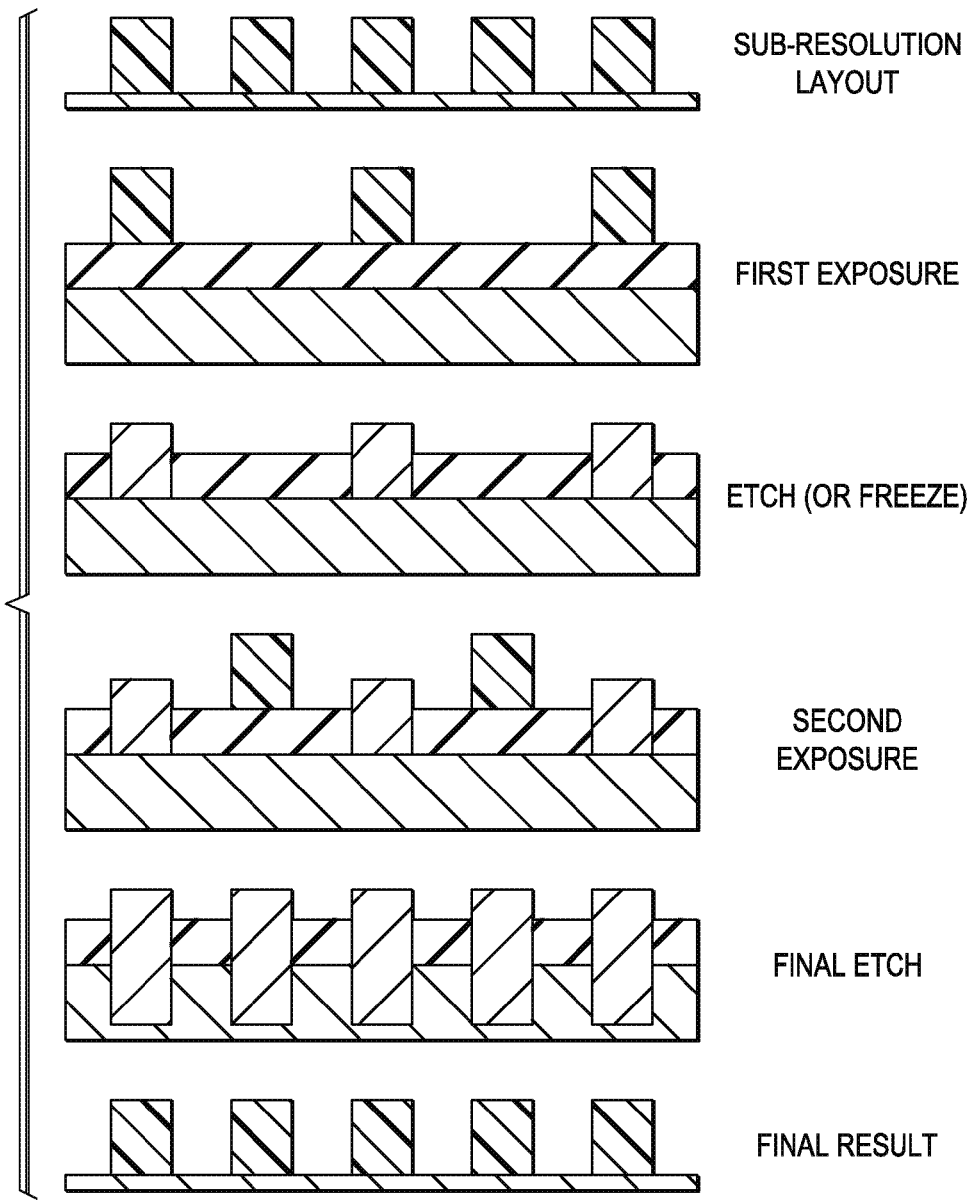
FIG. 1 illustrates pitch split double patterning flow in accordance with an example embodiment.

FIG. 1 illustrates pitch split double patterning flow in accordance with an example embodiment. The flow shown in FIG. 1 represents a litho-etch-litho-etch, or LELE, technique. The flow begins with a sub-resolution layout, which is the target design to be achieved. The flow makes a first exposure, performs an etch, makes a second exposure, and performs a final etch. Ideally, the final result should resemble the sub-resolution layout.

Figure 2:
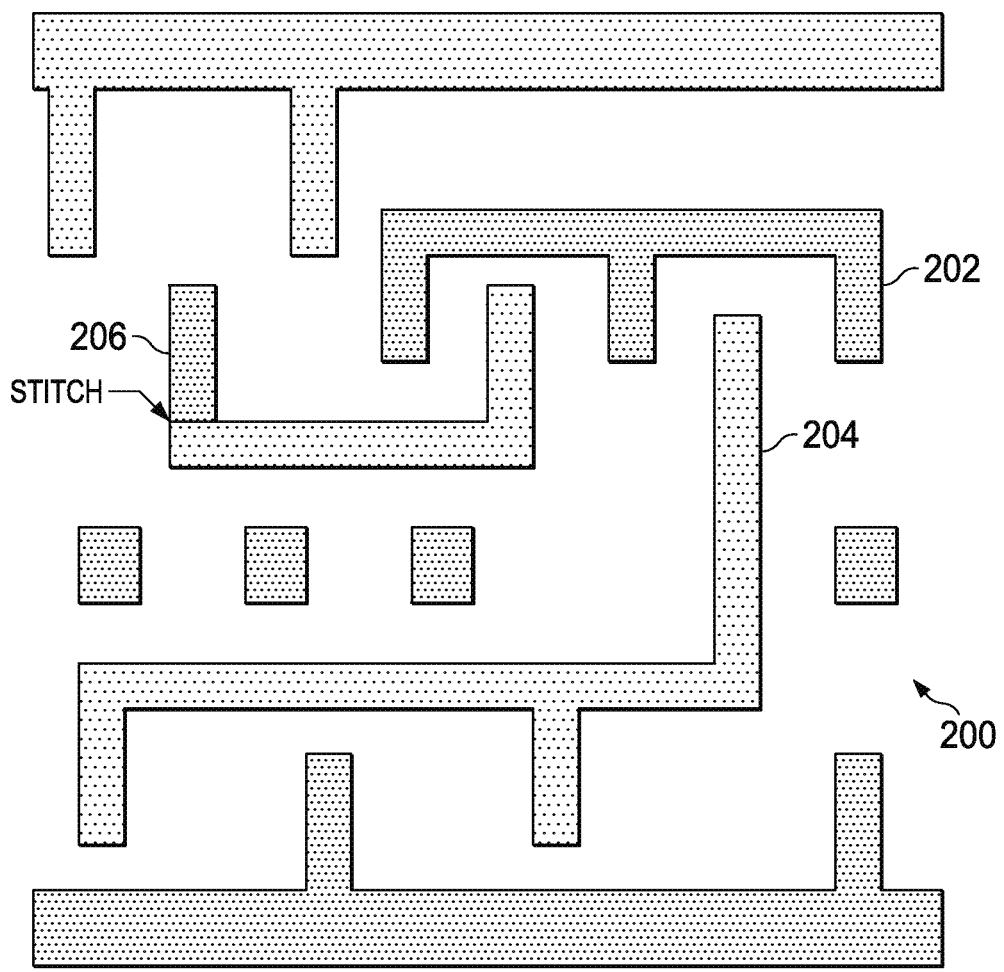
FIG. 2 is a diagram illustrating an example layout of wires to be formed using photolithography with which aspects of the illustrative embodiments may be implemented.

FIG. 2 is a diagram illustrating an example layout of wires to be formed using photolithography with which aspects of the illustrative embodiments may be implemented. Layout 200 comprises a plurality of two dimensional shapes of wires to be formed using double pattern lithography. As seen in FIG. 2, shape 202 is formed using a first mask (first color) and shape 204 is formed using a second mask (second color). In this example, according to the goal of the embodiments described herein, all shapes can be formed using two photolithographic masks. No two shapes of the same color are within a predetermined distance of one another. As seen in this example, shape 206 is formed using both the first mask and the second mask with a stitch where the masks overlap.

Mask assignment may be referred to as a "graph coloring problem," meaning the problem of coloring the shapes such that no two shapes of the same color are within a predetermined distance of one another. Stitching may be used to resolve a coloring conflict. However, not all conflicts can be resolved by stitching.

Figure 3A:
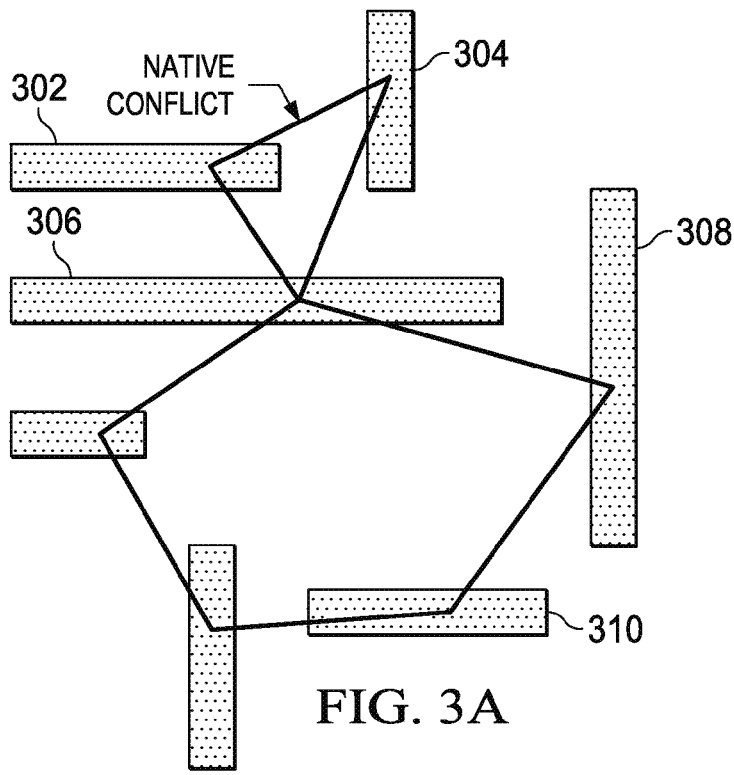
FIGS. 3A and 3B illustrate an example design with stitching and native conflicts for which aspects of the illustrative embodiments may be implemented.
Figure 3B:
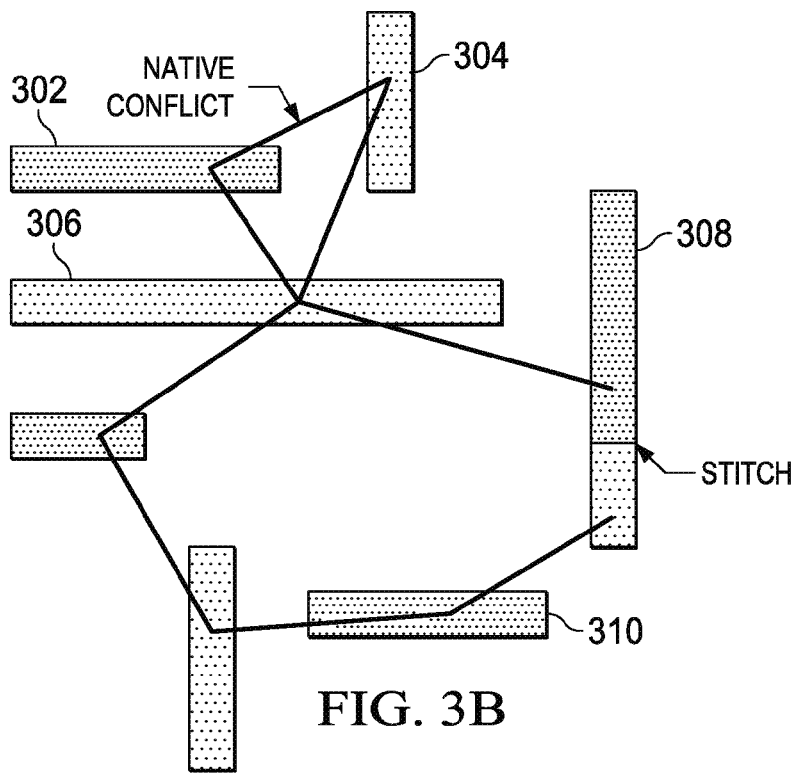

FIGS. 3A and 3B illustrate an example design with stitching and native conflicts for which aspects of the illustrative embodiments may be implemented. As seen in FIG. 3A, shapes 302, 304, 306, and 308 are too close to each other, referred to as native conflicts. FIG. 3B illustrates a solution with double pattern lithography. As seen in FIG. 3B, shape 302 and shape 306 are colored differently, thus resolving the conflict. Also, shape 308 is formed using two different masks with a stitch, thus resolving conflicts between shapes 306 and 308 and between shapes 308 and 310.

However, as shown in FIG. 3B, the conflict between shapes 304 and 306 cannot be resolved. No matter how shapes 302, 304, and 306 are colored, there will always be an unresolved conflict with double pattern lithography (DPL).

Figure 4:
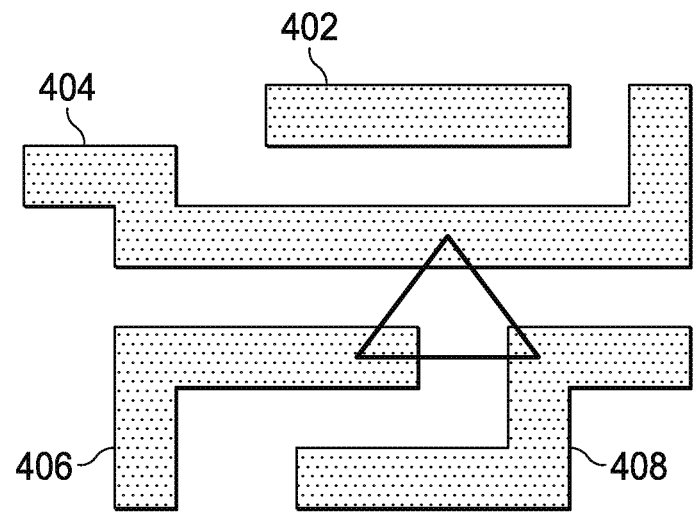
FIG. 4 is an example two-dimensional design with native conflicts for which aspects of the illustrative embodiments may be implemented.
Figure 5A:
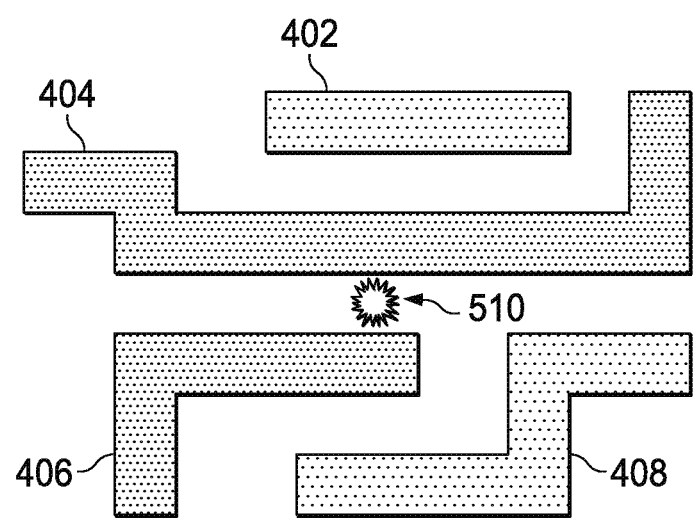
FIGS. 5A and 5B illustrate conflict removal for a two-dimensional design in accordance with an illustrative embodiment.
Figure 5B:
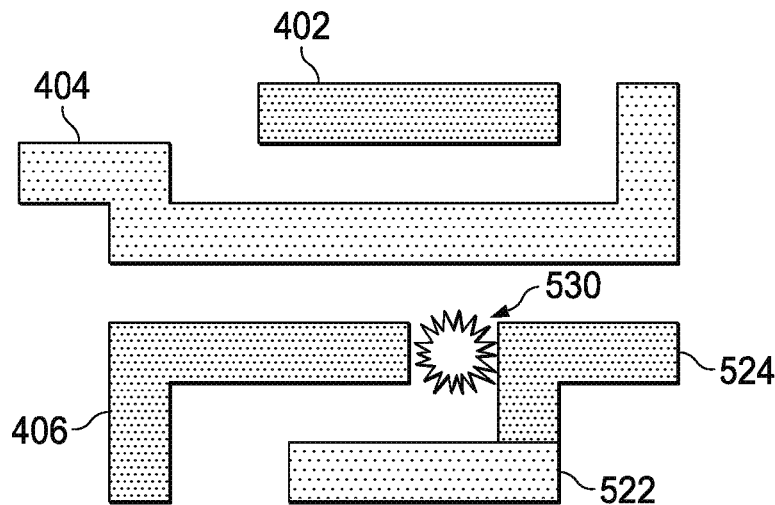

FIG. 4 is an example two-dimensional design with native conflicts for which aspects of the illustrative embodiments may be implemented. The design layout comprises shapes 402, 404, 406, 408. As seen in FIG. 4, shapes 404, 406, 408 represent a native conflict. To resolve the conflict, one must move one or more of shapes 404, 406, 408. FIGS. 5A and 5B illustrate conflict removal for a two-dimensional design in accordance with an illustrative embodiment.

As shown in FIG. 5A, shapes 402 and 408 are colored with a first mask, and shapes 404 and 406 are colored with a second mask. With double patterning, a conflict 510 still exists between shapes 404 and 406. Conflict 510 is very expensive to fix as the spacing between shapes 404 and 406 cannot be increased without significant layout perturbation.

As shown in FIG. 5B, shape 408 is replaced with shapes 522, 524, which are joined by a stitch. Shapes 404 and 522 are colored with a first mask, and shapes 402, 406, and 524 are colored with a second mask. Even with the stitch insertion joining shapes 522 and 524, a conflict 530 exists between shapes 406 and 524. Conflict 530 is easier to fix as the spacing between the conflicting features can be increased without significant layout perturbation.

In accordance with an illustrative embodiment, a multiple patterning mechanism is provided that performs coloring aware of the conflict removal overhead. The mechanism explicitly considers ease of conflict removal as one of the coloring objectives.

Figure 6:
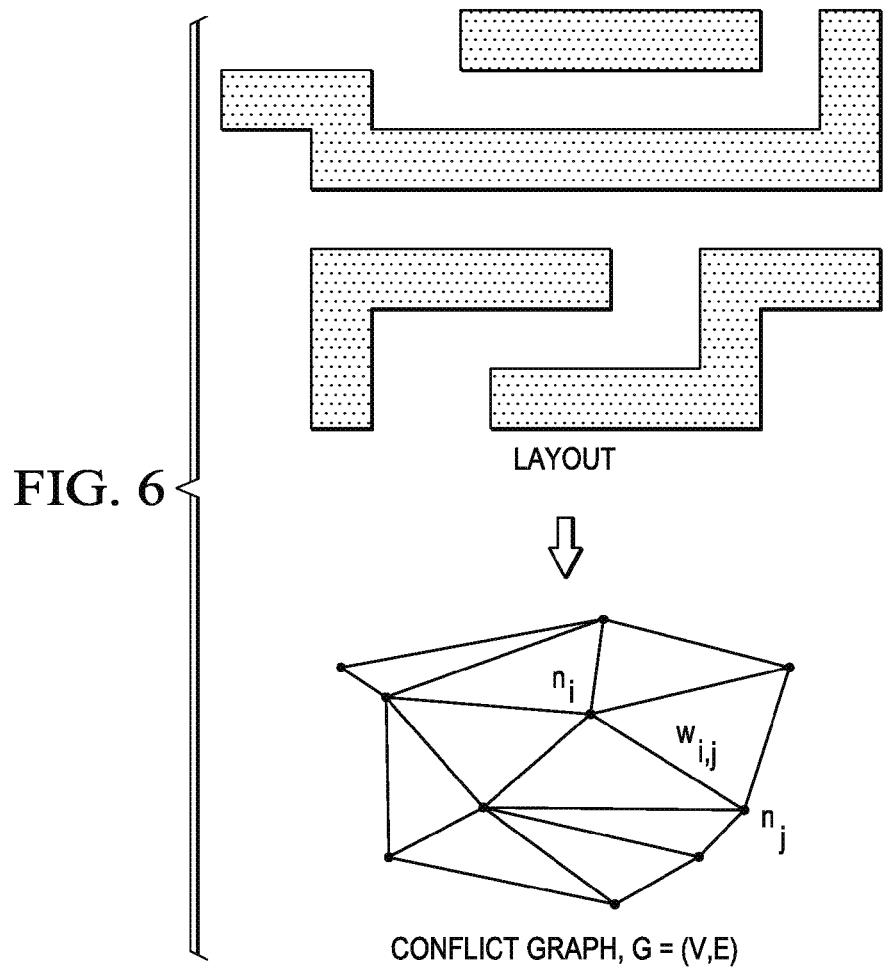
FIG. 6 illustrates generation of a conflict graph in accordance with an illustrative embodiment.

FIG. 6 illustrates generation of a conflict graph in accordance with an illustrative embodiment. The mechanism examines the design layout and generates a conflict graph. Each node, $n_i$, $n_j$ represents a feature in the design layout. Each edge, $e_{ij}$, represents a conflict between features. The mechanism assigns a weight, $w_{ij}$, to each edge representing the cost of the conflict removal. Weights are determined based on available spatial slack between conflicting features and the necessity of having the features (e.g. some features are redundant so they can be assigned a low cost). In one example embodiment, higher weight implies lower flexibility in conflict removal through layout perturbation. The mechanism uses weights to guide the multiple patterning coloring. The mechanism prioritizes conflicting features with higher weights to be assigned different colors.

In one example embodiment, the mechanism uses integer linear program (ILP) formulation to solve for the best coloring. In this example embodiment, the mechanism assigns binary (0, 1) variables, $x_i$ and $x_j$ for double patterning lithography (DPL), for the colors assigned to nodes $n_i$ and $n_j$, for example (in case of multiple patterning with k-masks, variables xi and xj will be integers with the values 0, 1, 2, ..., (k−1)). The mechanism also assigns binary variables $\lambda_{ij}$ with value 1 when $n_i$ and $n_j$ are colored differently and 0 otherwise. The mechanism attempts to solve the following:

Minimize:

$$\Sigma w_{ij} \times \lambda_{ij}$$

Subject to:

$$x_i - x_j \leq \lambda_{ij}, \forall e_{ij} \in E$$

$$x_j - x_i \leq \lambda_{ij}, \forall e_{ij} \in E$$

By solving the above, the mechanism minimizes the amount of perturbation by finding the coloring with the minimum cost of conflict removal.

Figure 7A:
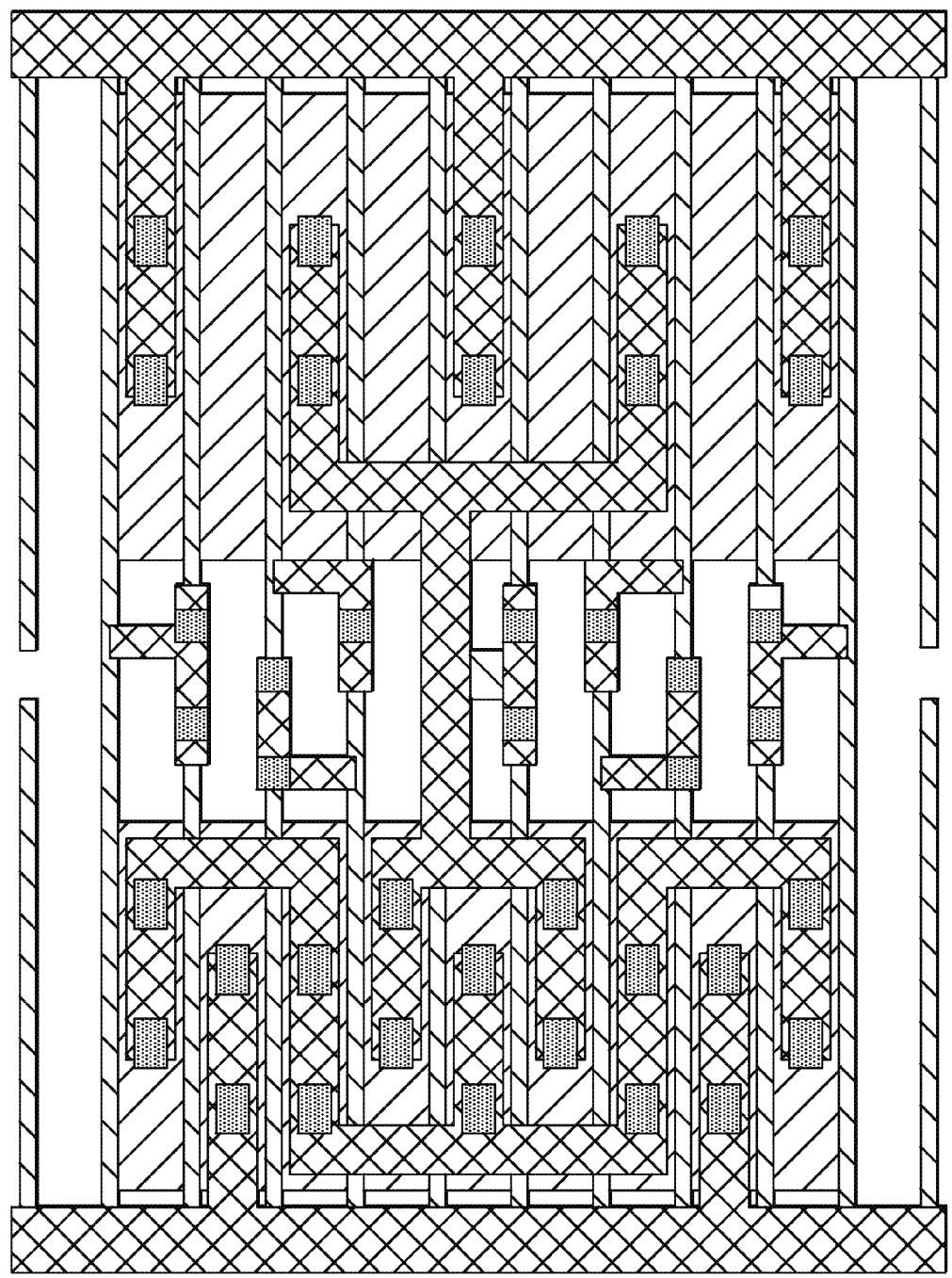
FIGS. 7A-7C illustrate an example of multiple patterning lithography with ease of conflict aware coloring in accordance with an illustrative embodiment.
Figure 7B:
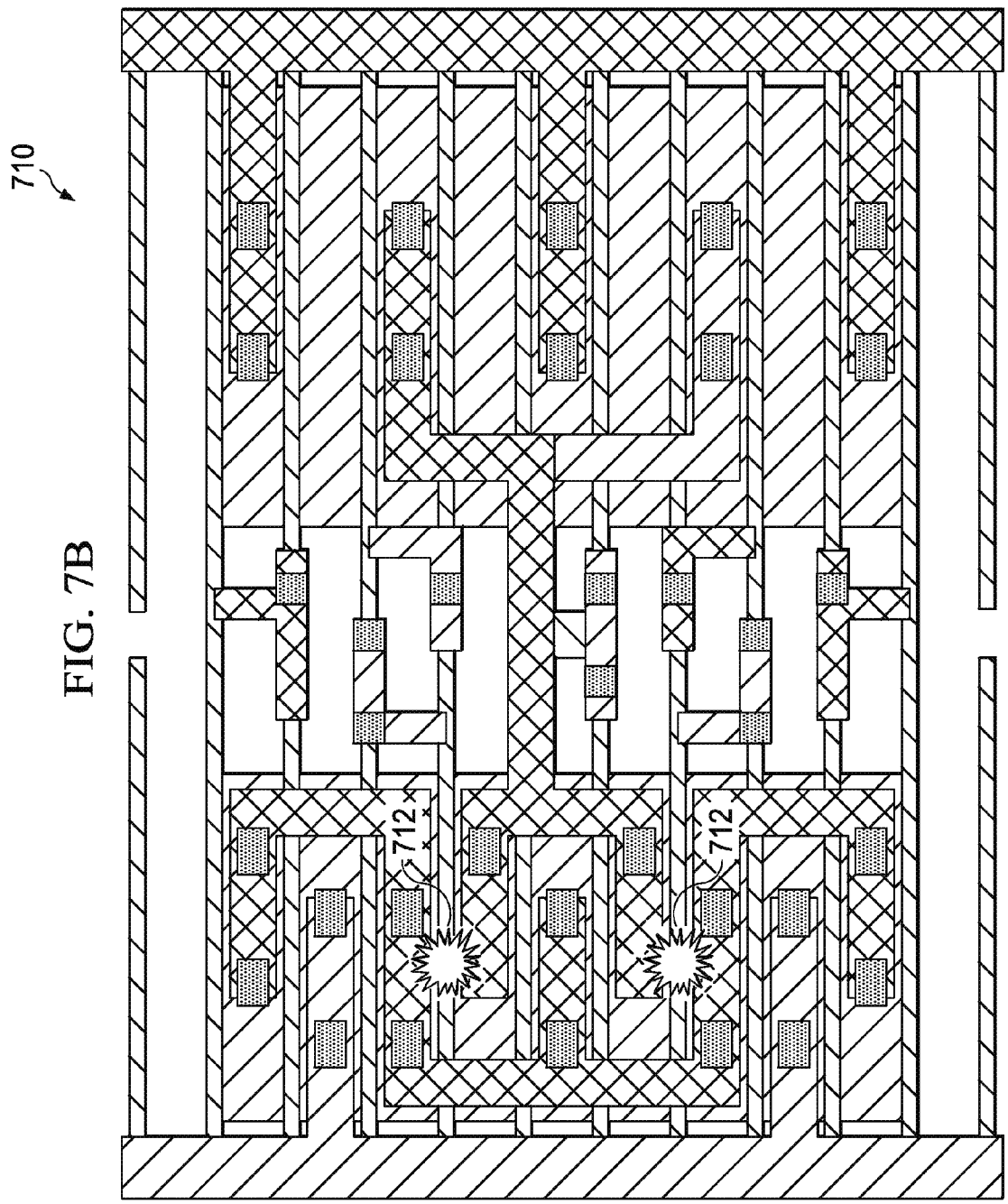
Figure 7C:
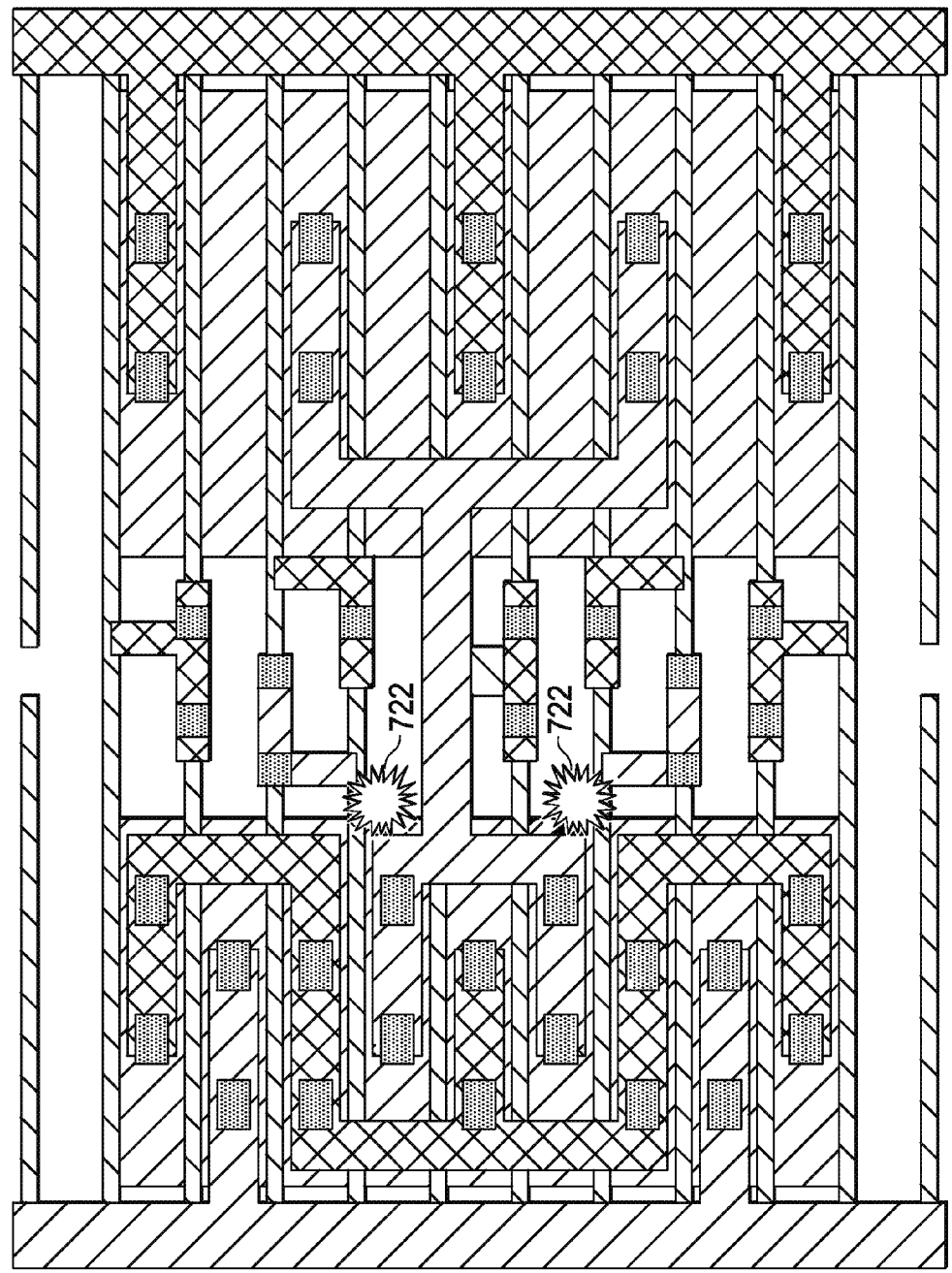

FIGS. 7A-7C illustrate an example of multiple patterning lithography with ease of conflict aware coloring in accordance with an illustrative embodiment. FIG. 7A shows the original design layout 700. FIG. 7B illustrates a layout 710 colored with conflict removal unaware coloring. The example shown in FIG. 7B contains conflicts 712 that are hard to resolve due to limited flexibility in feature movement. FIG. 7C illustrates a layout 720 colored with conflict removal aware coloring. The solution shown in FIG. 7C trades off hard to fix conflicts with conflicts 722 that are easier to fix.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block-diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 8:
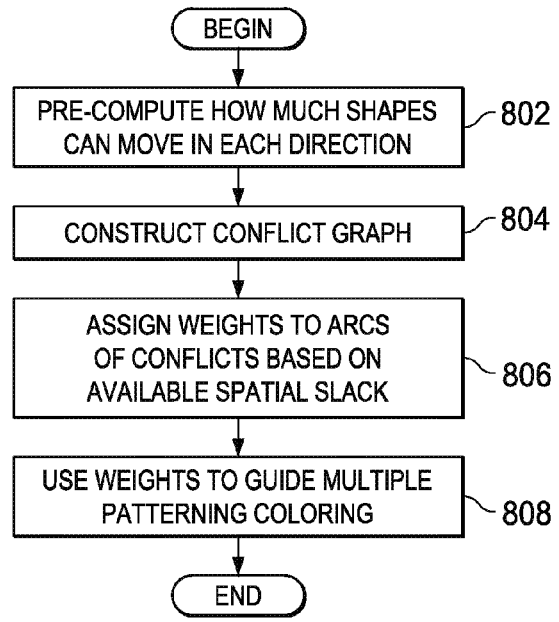
FIG. 8 is a flowchart illustrating operation of a mechanism for multiple patterning lithography with conflict removal aware coloring in accordance with an illustrative embodiment.

FIG. 8 is a flowchart illustrating operation of a mechanism for multiple patterning lithography with conflict removal aware coloring in accordance with an illustrative embodiment. Operation begins when the mechanism receives a design layout, and the mechanism pre-computes how much the shapes can move in each direction (block 802). The mechanism constructs a conflict graph (block 804) and assigns weights to arcs of conflicts based on available spatial slack (block 806). The mechanism then uses the weights to guide multiple patterning lithography (block 808). Thereafter, operation ends.

Operation of the flowchart of FIG. 8 results in a design layout with conflicts, if any, that are relatively easy to fix with little perturbation. One may then perform the process of photolithography to form an integrated circuit. While prior art approaches concentrate on minimizing the number of conflicts or the number of stitches, the mechanism of the illustrative embodiments focuses on minimizing the difficulty of removing remaining conflicts. Thus, the mechanism of the illustrative embodiments may result in more conflicts or more stitches than prior art approaches, but the cost of removing the conflicts will be reduced.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 9:
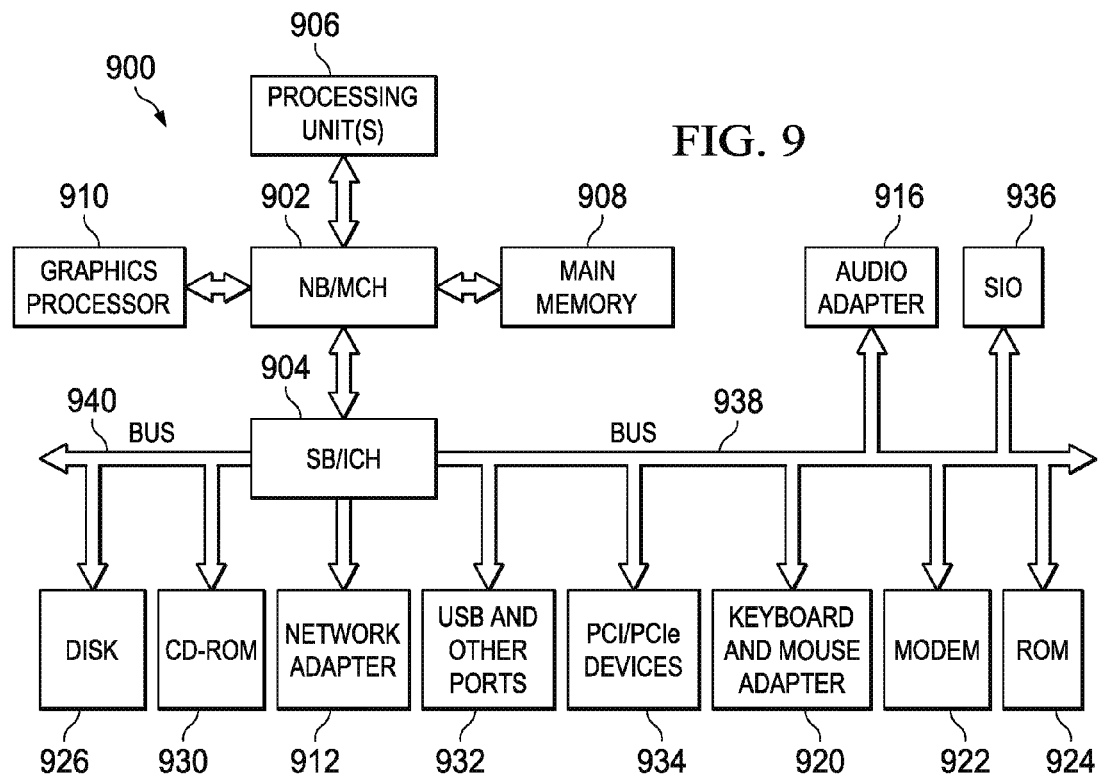
FIG. 9 is a block diagram of an example data processing system in which aspects of the illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments, FIG. 9 is provided hereafter as an example environment in which aspects of the illustrative embodiments may be implemented. It should be appreciated that FIG. 9 is only an example and is not intended to assert or imply any limitation with regard to the environments in which aspects or embodiments of the present invention may be implemented. Many modifications to the depicted environment may be made without departing from the spirit and scope of the present invention.

FIG. 9 is a block diagram of an example data processing system in which aspects of the illustrative embodiments may be implemented. Data processing system 900 is an example of a computer in which computer usable code or instructions implementing the processes for illustrative embodiments of the present invention may be located.

In the depicted example, data processing system 900 employs a hub architecture including north bridge and memory controller hub (NB/MCH) 902 and south bridge and input/output (I/O) controller hub (SB/ICH) 904. Processing unit 906, main memory 908, and graphics processor 910 are connected to NB/MCH 902. Graphics processor 910 may be connected to NB/MCH 902 through an accelerated graphics port (AGP).

In the depicted example, local area network (LAN) adapter 912 connects to SB/ICH 904. Audio adapter 916, keyboard and mouse adapter 920, modem 922, read only memory (ROM) 924, hard disk drive (HDD) 926, CD-ROM drive 930, universal serial bus (USB) ports and other communication ports 932, and PCI/PCIe devices 934 connect to SB/ICH 904 through bus 938 and bus 940. PCI/PCIe devices may include, for example, Ethernet adapters, add-in cards, and PC cards for notebook computers. PCI uses a card bus controller, while PCIe does not. ROM 924 may be, for example, a flash basic input/output system (BIOS).

HDD 926 and CD-ROM drive 930 connect to SB/ICH 904 through bus 940. HDD 926 and CD-ROM drive 930 may use, for example, an integrated drive electronics (IDE) or serial advanced technology attachment (SATA) interface. Super I/O (SIO) device 936 may be connected to SB/ICH 904.

An operating system runs on processing unit 906. The operating system coordinates and provides control of various components within the data processing system 900 in FIG. 9. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 900 (Java is a trademark of Oracle and/or its affiliates.).

As a server, data processing system 900 may be, for example, an IBM® eServer™ System p® computer system, running the Advanced Interactive Executive (ADC®) operating system or the LINUX operating system (IBM, eServer, System p, and ADC are trademarks of International Business Machines Corporation in the United States, other countries, or both, and LINUX is a registered trademark of Linus Torvalds in the United States, other countries, or both). Data processing system 900 may be a symmetric multiprocessor (SMP) system including a plurality of processors in processing unit 906. Alternatively, a single processor system may be employed.

Instructions for the operating system, the object-oriented programming system, and applications or programs are located on storage devices, such as HDD 926, and may be loaded into main memory 908 for execution by processing unit 906. The processes for illustrative embodiments of the present invention may be performed by processing unit 906 using computer usable program code, which may be located in a memory such as, for example, main memory 908, ROM 924, or in one or more peripheral devices 926 and 930, for example.

A bus system, such as bus 938 or bus 940 as shown in FIG. 9, may be comprised of one or more buses. Of course, the bus system may be implemented using any type of communication fabric or architecture that provides for a transfer of data between different components or devices attached to the fabric or architecture. A communication unit, such as modem 922 or network adapter 912 of FIG. 9, may include one or more devices used to transmit and receive data. A memory may be, for example, main memory 908, ROM 924, or a cache such as found in NB/MCH 902 in FIG. 9.

Those of ordinary skill in the art will appreciate that the hardware in FIG. 9 may vary depending on the implementation. Other internal hardware or peripheral devices, such as flash memory, equivalent non-volatile memory, or optical disk drives and the like, may be used in addition to or in place of the hardware depicted in FIG. 9. Also, the processes of the illustrative embodiments may be applied to a multiprocessor data processing system, other than the SMP system mentioned previously, without departing from the spirit and scope of the present invention.

Moreover, the data processing system 900 may take the form of any of a number of different data processing systems including client computing devices, server computing devices, a tablet computer, laptop computer, telephone or other communication device, a personal digital assistant (PDA), or the like. In some illustrative examples, data processing system 900 may be a portable computing device which is configured with flash memory to provide non-volatile memory for storing operating system files and/or user-generated data, for example. Essentially, data processing system 900 may be any known or later developed data processing system without architectural limitation.

Thus, the illustrative embodiments provide mechanisms for multiple patterning lithography with conflict removal aware coloring. The mechanism of the illustrative embodiments makes multiple patterning coloring aware of the conflict removal overhead. The coloring solution explicitly considers ease of conflict removal as one of the coloring objectives. The mechanism pre-computes how much shapes can move in each direction. The mechanism generates a conflict graph where nodes represent shapes in the layout and edges represent conflicts between shapes. The mechanism assigns weights to edges based on available spatial slack between conflicting features. The mechanism then uses the weights to guide multiple patterning coloring. The mechanism prioritizes conflicting features with higher weights to be assigned different colors.

The mechanisms of the illustrative embodiments address key challenges of layout decomposition for double patterning lithography implementations in 15 nm node and beyond. The mechanism reduces cost of post-coloring conflict removal. The mechanism provides improved results from automated conflict removal tools, such as layout migration with split level rules.

The illustrative embodiments and depicted examples show double patterning lithography; however, the aspects of the illustrative embodiments may apply to three or more exposures.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for multiple patterning lithography with conflict removal aware coloring, the method comprising:
    receiving a design layout for performing a multiple patterning photolithographic process to form an integrated circuit;
    generating, by the data processing system, a conflict graph representing conflicts between shapes;
    assigning, by the data processing system, weights to conflicts in the conflict graph representing ease of conflict removal to form a weighted conflict graph;
    performing, by the data processing system, coloring of the design layout based on the weighted conflict graph to form a colored design layout, wherein performing coloring of the design layout comprises performing integer linear program formulation to minimize weight of edges of the conflict graph after coloring; and
    performing the multiple patterning photolithographic process using the colored design layout to form the integrated circuit.

2. The method of claim 1, wherein generating a conflict graph comprises:
    generating a graph comprising nodes, wherein each node represents a shape in the design layout, and edges, wherein each edge connects two nodes and represents a coloring conflict between the shapes represented by the two nodes.

3. The method of claim 2, further comprising:
    determining how much each shape in the design layout can move in each direction,
    wherein assigning weights to edges in the conflict graph comprises assigning the based on how much shapes represented by the nodes can move in each direction.

4. The method of claim 3, wherein assigning the weights comprises:
    assigning the weights such that higher weight implies lower flexibility in conflict removal through layout perturbation.

5. The method of claim 3, wherein performing coloring of the design layout comprises:
    prioritizing conflicting shapes with higher weights to be assigned different colors.

6. The method of claim 1, wherein performing integer linear program formulation comprises:
    minimizing $\Sigma w_{ij} \times \lambda_{ij}$, subject to $x_i - x_j \leq \lambda_{ij}, \forall e_{ij} \epsilon E$ $x_j - x_i \leq \lambda_{ij}, \forall e_{ij} \epsilon E$, where $w_{ij}$ is a weight of edge $e_{ij}$ between node $n_i$ and node $N_j$, $x_i$ and $x_j$ are binary variables, in case of double patterning, or integer variables, in case of multiple patterning, for colors assigned to nodes $n_i$ and $n_j$, $\lambda_{ij}$ is a binary variable with a first value when $n_i$ and $n_j$ are colored differently and second value otherwise, and E is a set of edges in the conflict graph.

7. A computer program product comprising a non transitory computer readable storage medium having a computer readable program stored therein, wherein the computer readable program, when executed on a computing device, causes the computing device to:
    receive a design layout for performing a multiple patterning photolithographic process to form an integrated circuit design;
    generate a conflict graph representing conflicts between shapes;
    assign weights to conflicts in the conflict graph representing ease of conflict removal to form a weighted conflict graph;
    perform coloring of the design layout based on the weighted conflict graph to form a colored design layout, wherein performing coloring of the design layout comprises performing integer linear program formulation to minimize weight of the conflict graph after coloring; and
    perform the multiple patterning photolithographic process using the colored design layout.

8. The computer program product of claim 7, wherein generating a conflict graph comprises:
    generating a graph comprising nodes, wherein each node represents a shape in the design layout, and edges, wherein each edge connects two nodes and represents a coloring conflict between the shapes represented by the two nodes.

9. The computer program product of claim 8, wherein the computer readable program further causes the computing device to:
    determine how each shape in the design layout can move in each direction, wherein assigning weights to edges in the conflict graph comprises assigning the weights based on how much shapes represented by the nodes can move in each direction.

10. The computer program product of claim 9, wherein assigning the weigh comprises:
assigning the weights such that higher weight implies lower flexibility in conflict removal through layout perturbation.

11. The computer program product of claim 9, wherein performing coloring of the design layout comprises:
prioritizing conflicting shapes with higher weights to be assigned different colors.

12. The computer program product of claim 7, wherein performing integer linear program formulation comprises:
minimizing $\Sigma w_{ij} \times \lambda_{ij}$, subject to $x_i - x_j \leq \lambda_{ij}, \forall e_{ij} \in E$ $x_j - x_i \leq \lambda_{ij}, \forall e_{ij} \in E,$ where $w_{ij}$ is a weight of edge $e_{ij}$ between node $n_i$ and node $n_j$, $x_i$ and $x_j$ are binary variables, in case of double patterning, or integer variables, in case of multiple patterning, for colors assigned to nodes $n_i$ and $n_j$, $\lambda_{ij}$ is a binary variable with a first value when $n_i$ and $n_j$ are colored differently and second value otherwise, and E is a set of edges in the conflict graph.

13. The computer program product of claim 7, wherein the computer readable program is stored in a computer readable storage medic in a data processing system and wherein the computer readable program was downloaded over a network from a remote data processing system.

14. The computer program product of claim 7, wherein the computer readable program is stored in a computer readable storage medium in a server data processing system and wherein the computer readable program is downloaded over a network to a remote data processing system for use in a computer readable storage medium with the remote system.

15. An apparatus, comprising:
a processor; and
a memory coupled to the processor, wherein the memory comprises instructions which, when executed by the processor, cause the processor to:
receive a design layout for performing a multiple patterning photolithographic process to form an integrated circuit design;
generate a conflict graph representing conflicts between shapes;
assign weights to conflicts in the conflict graph representing ease of conflict removal to form a weighted conflict graph;
perform coloring of the design layout based on the weighted conflict graph to form a colored design layout, wherein performing coloring of the design layout comprises performing integer linear program formulation to minimize weight of edges of the conflict graph after coloring; and
perform the multiple patterning photolithographic process using the colored design layout.

16. The apparatus of claim 15, wherein generating a conflict graph comprises:
generating a graph comprising nodes, wherein each node represents a shape in the design layout, and edges, wherein each edge connects two nodes and represents a coloring conflict between the shapes represented by the two nodes.

17. The apparatus of claim 16, wherein the instructions further cause the processor to:
determine how much each shape in the design layout can move in each direction,
wherein assigning weights to edges in the conflict graph comprises assigning the weights based on how much shapes represented by the nodes can move in each direction.

18. The apparatus of claim 17, wherein performing coloring of the design layout comprises:
prioritizing conflicting shapes with higher weights to be assigned different colors.

19. The apparatus of claim 17, wherein assigning the weights comprises:
assigning the weights such that higher weight implies lower flexibility in conflict removal through layout perturbation.

20. The apparatus of claim 15, wherein performing integer linear program formulation comprises:
minimizing $\Sigma w_{ij} \times \lambda_{ij}$, subject to $x_i - x_j \leq \lambda_{ij}, \forall e_{ij} \in E$ $x_j - x_i \leq \lambda_{ij}, \forall e_{ij} \in E,$ where $w_{ij}$ is a weight of edge $e_{ij}$ between node $n_i$ and node $n_j$, $x_i$ and $x_j$ are binary variables, in case of double patterning, or integer variables, in case of multiple patterning, for colors assigned to nodes $n_i$ and $n_j$, $\lambda_{ij}$ is a binary variable with a first value when $n_i$ and $n_j$ are colored differently and second value otherwise, and E is a set of edges in the conflict graph.

* * * * *